United States Patent
Yang et al.

(10) Patent No.: US 12,379,410 B2
(45) Date of Patent: Aug. 5, 2025

(54) CHIP REMOVING APPARATUS FOR REPAIR PROCESS OF MICRO-LED DISPLAY

(71) Applicant: LG ELECTRONICS INC., Seoul (KR)

(72) Inventors: Inbum Yang, Seoul (KR); Sangsik Jung, Seoul (KR); Junghun Rho, Seoul (KR); Bongwoon Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 115 days.

(21) Appl. No.: 18/041,166

(22) PCT Filed: Aug. 24, 2020

(86) PCT No.: PCT/KR2020/011230
§ 371 (c)(1),
(2) Date: Feb. 9, 2023

(87) PCT Pub. No.: WO2022/045376
PCT Pub. Date: Mar. 3, 2022

(65) Prior Publication Data
US 2023/0266379 A1    Aug. 24, 2023

(51) Int. Cl.
*G01R 31/26* (2020.01)
*H01L 25/075* (2006.01)

(52) U.S. Cl.
CPC ...... *G01R 31/2601* (2013.01); *H01L 25/0753* (2013.01)

(58) Field of Classification Search
CPC ..... G01R 31/26; G01R 31/2601; H01L 23/00; H01L 25/0753; G09G 3/006; G09G 3/30; G09G 3/32
See application file for complete search history.

(56) References Cited

U.S. PATENT DOCUMENTS

| | | | |
|---|---|---|---|
| 2003/0112331 A1* | 6/2003 | Chen | G09G 3/006 348/125 |
| 2009/0065133 A1* | 3/2009 | Takahashi | H01L 21/6836 428/343 |

(Continued)

FOREIGN PATENT DOCUMENTS

| | | |
|---|---|---|
| JP | 2000243764 | 9/2000 |
| KR | 10-2013-0007897 | 1/2013 |

(Continued)

OTHER PUBLICATIONS

PCT International Application No. PCT/KR2020/011230, International Search Report dated May 24, 2021, 4 page.

*Primary Examiner* — Huy Q Phan
*Assistant Examiner* — David B Frederiksen
(74) *Attorney, Agent, or Firm* — LEE, HONG, DEGERMAN, KANG & WAIMEY

(57) ABSTRACT

A chip removing apparatus for a repair process of a μLED display comprises: a stage unit on which a substrate having at least one chip arranged thereon is mounted; a film stage on which an adhesive film is mounted such that the adhesive film is located on the substrate; a head having a pin which pressurizes the adhesive film such that the chip is attached to the lower surface of the adhesive film; and a head driver for moving the head.

11 Claims, 15 Drawing Sheets

(a)    (b)    (c)

(56) References Cited

U.S. PATENT DOCUMENTS

| | | | |
|---|---|---|---|
| 2011/0189835 A1* | 8/2011 | Sugo | B32B 7/12 |
| | | | 438/464 |
| 2015/0360940 A1* | 12/2015 | Bathurst | H02N 13/00 |
| | | | 74/470 |
| 2016/0293463 A1* | 10/2016 | Nishizaki | H01L 21/681 |
| 2017/0092613 A1* | 3/2017 | Bilewicz | G02B 17/008 |
| 2017/0243786 A1* | 8/2017 | Yoshino | H01L 21/78 |
| 2018/0309019 A1* | 10/2018 | Liao | H01L 25/50 |
| 2019/0035688 A1* | 1/2019 | Chen | H01L 21/7813 |
| 2019/0333791 A1* | 10/2019 | Hussell | H01L 21/67132 |
| 2020/0013318 A1* | 1/2020 | Pappas | H01L 21/7806 |

FOREIGN PATENT DOCUMENTS

| | | | |
|---|---|---|---|
| KR | 10-2013-0040006 | | 4/2013 |
| KR | 10-2018-0087896 | | 8/2018 |
| KR | 20180087896 A | * | 8/2018 |
| KR | 10-1953645 | | 3/2019 |
| KR | 101953645 B1 | * | 3/2019 |

\* cited by examiner

CHIP REMOVING APPARATUS FOR REPAIR PROCESS OF MICRO-LED DISPLAY

CROSS-REFERENCE TO RELATED APPLICATION(S)

This application is the National Stage filing under 35 U.S.C. 371 of International Application No. PCT/KR2020/011230, filed on Aug. 24, 2020, the contents of which are all hereby incorporated by reference herein in its entirety.

TECHNICAL FIELD

The present invention relates to a manufacturing apparatus capable of producing a micro-LED (μLED) display, and more specifically relates to a chip removing apparatus for repair process of μLED display.

BACKGROUND ART

Recently, display devices with excellent characteristics such as thin and flexible have been developed in a field of display technology. On the other hand, the main displays currently commercially available are represented by LCD (Liquid Crystal Display) and AMOLED (Active Matrix Organic Light Emitting Diode).

However, the LCD have problems in that response time is not fast and flexible implementation is difficult. The AMOLED has problems such as short lifespan and poor mass production yield.

On the other hand, light emitting diode (LED) is a well-known semiconductor light emitting device that converts current into light. Starting with the commercialization of red LEDs using GaAsP compound semiconductors in 1962, they have been used as light sources for display images in electronic device including information communication device along with GaP:N series green LEDs. Thus, by implementing the display (i.e., LED display) using the semiconductor light emitting device, a method for solving the above problems may be presented. The LED display has a variety of advantages, such as long life, low power consumption, excellent initial driving characteristics, and high vibration resistance compared to filament-based light emitting element.

On the other hand, recently, μLED with a size of 10 to 100 micrometers, which are about $\frac{1}{10}$ the length and $\frac{1}{100}$ the area of general light emitting diode (LED), are gradually increasing.

Compared to conventional LED, the μLED has faster response time, supports lower power and higher luminance, and do not break even when the display is bent.

In the case of a display applying the μLED, it is possible to perform a light emitting test to test emission of the μLED after transferring the μLED to a substrate or an interposer, and if there is a malfunctioning μLED, a repair process is carried out.

Defective chips among μLEDs include defects due to transfer (chip damage, poor positioning accuracy, etc.) and poor characteristics (operating voltage, current, power, etc.).

The manufacturing process of μLED display may include an inspection process for inspecting a defective chip. The inspection process may include an inspection to inspect and measure whether or not there is a transfer abnormality and a chip appearance abnormality, and a lighting inspection to inspect the characteristics of the chip transferred to the substrate.

A repair process to remove a defective chip may be performed during the production of μLED.

As an example of the repair process, in a state in which chips in the main area and chips in the redundancy area are transferred to the substrate together, the chips in the main area determined to be defective through inspection are short-circuited with electrodes. Thereafter, the chips of the good product transferred to the redundancy area are connected to the electrode, and the chips determined to be defective may be replaced with the chips of the good product transferred to the redundancy area.

However, this repair process has the disadvantage that if both the chip in the main area and the chip in the redundancy region is a defective chip, there is no way to replace the pixel with a normal chip, and the cost increases due to the addition of chips in the redundancy area.

As another example of the repair process, a defective chip removing process of removing defective chip and a re-transfer process of re-transferring new chips to replace the removed defective chip may be included. In this case, compared to the case where the redundancy area chip is transferred together with the main area chip, a cost-saving and highly reliable μLED display may be manufactured.

DISCLOSURE

Technical Problem

An object of the embodiment is to provide a chip removing apparatus for repair process of μLED display able to remove a defective chip of the substrate with high reliability by an adhesive film.

Technical Solution

According to the embodiment, a chip removing apparatus for repair process of a micro-LED display, comprising: a stage unit on which a substrate on which at least one chip is disposed is seated; a film stage on which an adhesive film is seated to position the adhesive film on the substrate; a head having a pin for pressing the adhesive film to attach the chip to a lower surface of the adhesive film; and a head driver configured to move the head.

The chip removing apparatus further comprises a base configured to support the stage unit and the film stage.

The stage unit includes a substrate seating body on which the substrate is seated. The substrate seating body is transparent or translucent.

The stage unit includes an adsorption line for adsorbing the substrate.

The film stage includes a seating body on which the adhesive film is placed; an inner ring on which the adhesive film is placed; and an outer ring that holds the adhesive film together with the inner ring.

The film stage further includes a lifting mechanism configured to move up and down at least one of the inner ring or the seating body.

The head driver moves the head in X, Y, and Z axes.

The head driver includes a tilting mechanism for tilting the pin.

The chip removing apparatus further comprises a sensor configured to measure a distance between a lower end of the pin and the adhesive film or a distance between the lower end of the pin and the substrate.

The chip is provided in plurality on the substrate. The chip removing apparatus further comprises an upper vision configured to sense a position of a defective chip among the plurality of chips.

The chip removing apparatus further comprises a lower vision configured to monitor the pin through the stage unit.

Advantageous Effects

According to an embodiment of the present invention, an adhesive film seated on a film stage may be pressed by pins and may come into contact with defective chips on the substrate. When the pin is raised, the adhesive film can separate the defective chip from the substrate. Upon movement of the pin, the adhesive film can sequentially separate a plurality of defective chips from the substrate. The number of steps and time to separate the plurality of defective chips from the substrate may be reduced.

MODE FOR INVENTION

Figure 1:
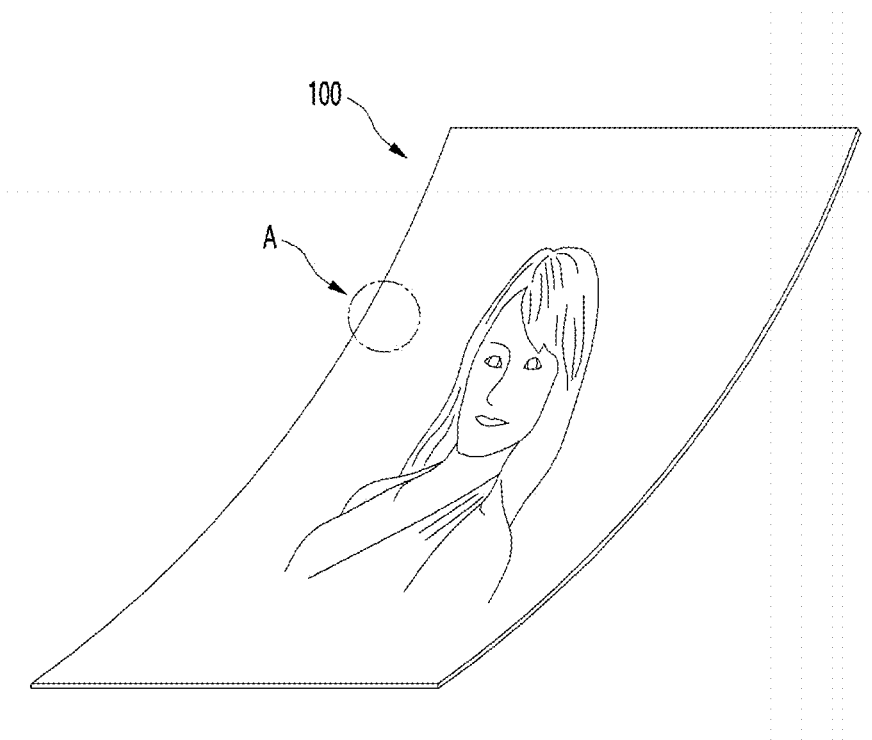
FIG. 1 is a conceptual diagram showing an embodiment of a display device using a semiconductor light emitting device of the present invention.

Hereinafter, a specific embodiment of the present invention will be described in detail with the drawings.

Hereinafter, the embodiments disclosed in this specification will be described in detail with reference to the accompanying drawings, but the same or similar components are assigned the same reference numerals regardless of reference numerals, and redundant description thereof will be omitted. The suffixes "module" and "unit" for components used in the following description are given or used together in consideration of ease of writing the specification, and do not have meanings or roles that are distinct from each other by themselves. In addition, in describing the embodiments disclosed in this specification, if it is determined that detailed descriptions of related known technologies may obscure the gist of the embodiments disclosed in this specification, the detailed descriptions thereof will be omitted. In addition, it should be noted that the accompanying drawings are only for easy understanding of the embodiments disclosed in this specification, and should not be construed as limiting the technical idea disclosed in this specification by the accompanying drawings.

It is also to be understood that when an element such as a layer, region or substrate is referred to as being "on" another element, it may be directly on another element or intervening elements may exist therebetween.

The display device described herein may include mobile phone, smartphone, laptop computer, digital broadcasting terminals, personal digital assistant (PDA), portable multimedia player (PMP), navigation, Slate PC, Tablet PC, Ultra Book, digital TV, desktop computers, or the like. However, those skilled in the art will readily recognize that the configuration according to the embodiment described in this specification may be applied to a device capable of displaying even a new product type to be developed in the future.

FIG. 1 is a conceptual diagram showing an embodiment of a display device using a semiconductor light emitting device of the present invention.

According to the drawing, information processed in a controller of the display device 100 may be displayed using a display such as a flexible display or the like.

An example of the display may be flexible, bendable, twistable, foldable, or rollable by an external force. For example, the display may be a flexible display manufactured on a thin and flexible substrate that may be flexible, bendable, twistable, foldable, or rollable like paper while maintaining display characteristics of a conventional flat panel display.

In the state in which the flexible display does not bend (e.g., a state having an infinite radius of curvature, hereinafter referred to as a first state), a display area of the flexible display is a flat surface. In the state curved by the external force in the first state (e.g., a state having a finite radius of curvature, hereinafter referred to as a second state), the display area may be a curved surface. As shown in the drawing, the information displayed in the second state may be visual information output on the curved surface.

The visual information of the display is implemented by independently controlling emission of a unit pixel arranged in a matrix. The unit pixel refers to the minimum unit for implementing one color.

The unit pixel of the display may be implemented by a semiconductor light emitting device. In the present invention, it illustrates a light emitting diode (LED) as a kind of a semiconductor light emitting device that converts current into light. The light emitting diode is formed in a small size, through which it is possible to play the role of a unit pixel in the second state.

Hereinafter, the display implemented using the light emitting diode will be described in more detail with reference to the drawings.

Figure 2:
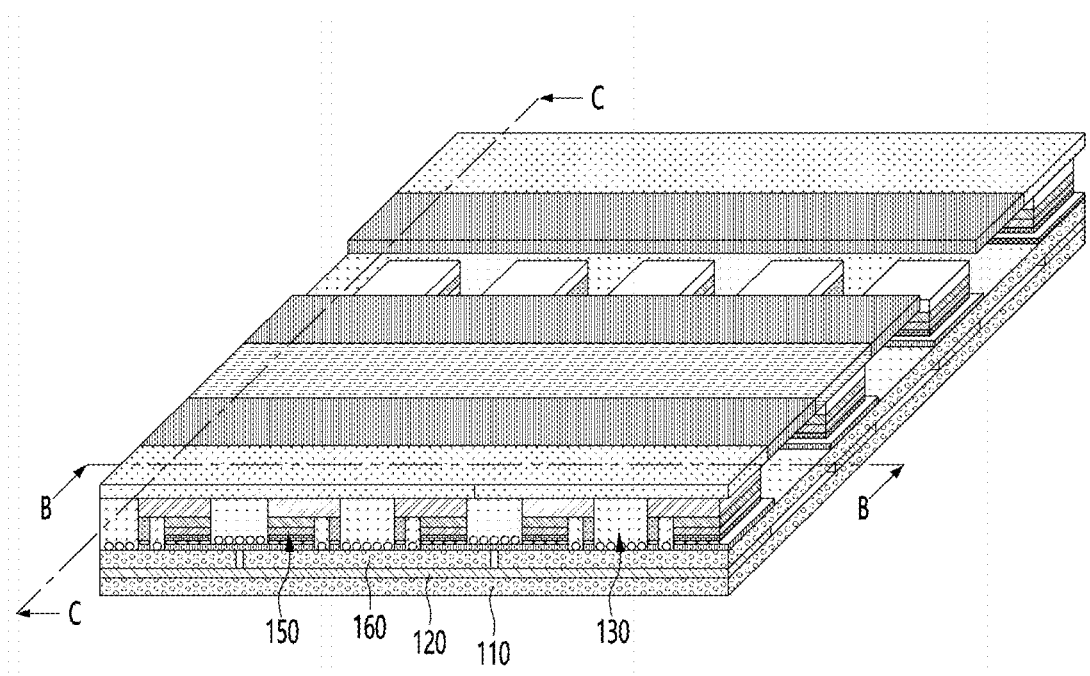
FIG. 2 is a partially enlarged view of A region of FIG. 1, and FIG. 3A and FIG. 3B are cross-sectional views taken along line B-B and line C-C of FIG. 2.
Figure 3A:
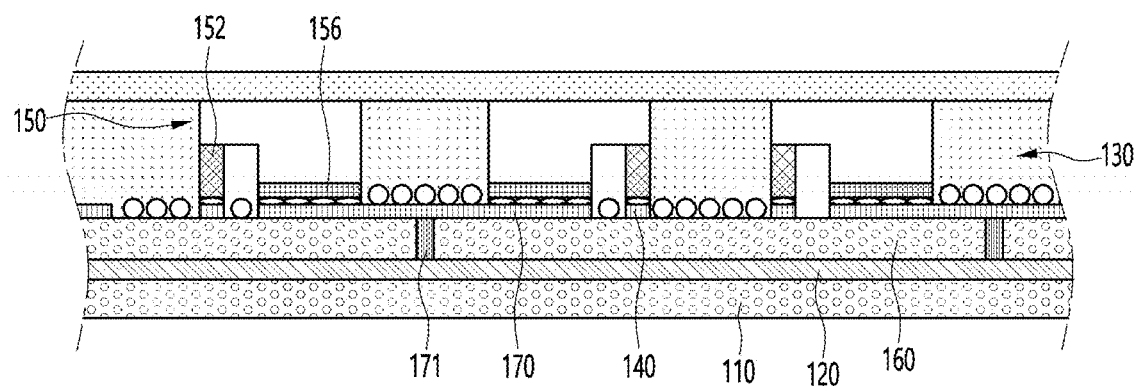
Figure 3B:
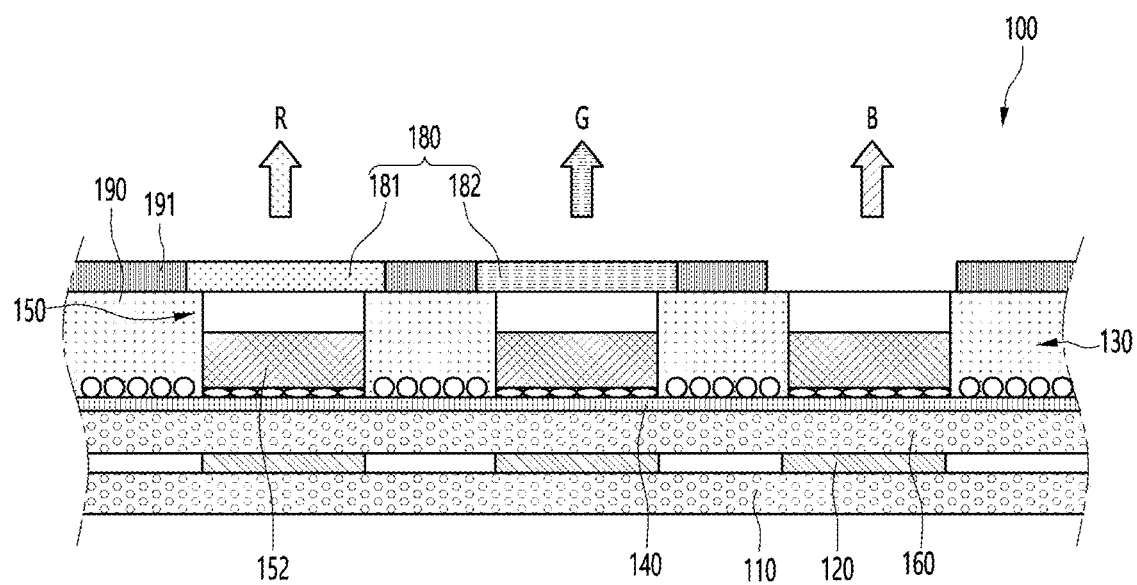
Figure 4:
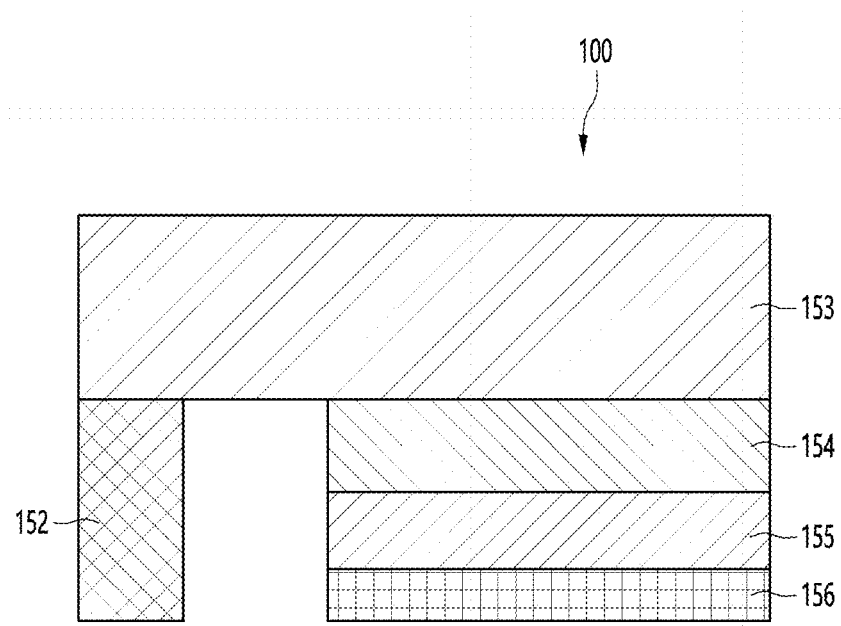
FIG. 4 is a conceptual diagram showing a flip chip type semiconductor light emitting device of FIG. 3.

FIG. 2 is a partially enlarged view of A region of FIG. 1, and FIG. 3A and FIG. 3B are cross-sectional views taken along line B-B and line C-C of FIG. 2. FIG. 4 is a conceptual view showing a flip chip type semiconductor light emitting device of FIG. 3A, and FIG. 5A to FIG. 5C are conceptual diagrams showing various forms of implementing a color in relation to a flip chip type semiconductor light emitting device.

Referring to FIG. 2, FIG. 3A and FIG. 3B, as the display device 100 using a semiconductor light emitting device, a display device 100 using a passive matrix (PM) type semiconductor light emitting device is exemplified. However, the example described below is also applicable to an active matrix (AM) type semiconductor light emitting device.

The display device 100 includes a substrate 110, a first electrode 120, a conductive adhesive layer 130, a second electrode 140 and a plurality of semiconductor light emitting devices 150.

One example of the substrate 110 may be a flexible substrate. For example, the substrate 110 may include glass or polyimide (PI) in order to implement a flexible display device. In addition, any insulating and flexible material such as polyethylene naphthalate (PEN) and polyethylene terephthalate (PET) may be used. In addition, the substrate 110 may be any transparent material or opaque material.

The substrate 110 may be a wiring substrate on which the first electrode 120 is disposed, and thus the first electrode 120 may be located on the substrate 110.

According to the drawing, the insulating layer 160 may be disposed on the substrate 110 where the first electrode 120 is located, and an auxiliary electrode 170 is located on the insulating layer 160. In this case, by stacking the insulating layer 160 on the substrate 110, it may be a single wiring substrate. More specifically, the insulating layer 160 is made of an insulating and flexible material such as polyimide (PI, Polyimide), PET, PEN, etc., and may be integrally formed with the substrate 110 to form a single substrate.

The auxiliary electrode 170 is an electrode that electrically connects the first electrode 120 and the semiconductor light emitting device 150, is located on the insulating layer 160, and is disposed corresponding to the position of the first electrode 120. For example, the auxiliary electrode 170 has a dot form, and may be electrically connected to the first electrode 120 through by an electrode hole 171 through the insulating layer 160. The electrode hole 171 may be formed by the filling of a conductive material in via hole.

Referring to the present drawings, a conductive adhesive layer 130 is formed on one surface of the insulating layer 160, but the present invention is not necessarily limited thereto. For example, a layer is formed to perform a specific function between the insulating layer 160 and the conductive adhesive layer 130, or the conductive adhesive layer 130 is also possible a structure to be disposed on the substrate 110 without the insulating layer 160. In the structure in which the conductive adhesive layer 130 is disposed on the substrate 110, the conductive adhesive layer 130 may serve as an insulating layer.

The conductive adhesive layer 130 may be a layer having adhesion and conductivity, and for this purpose the conductive adhesive layer 130 may be mixed with a material having conductivity and a material having adhesion. In addition, the conductive adhesive layer 130 has ductility, thereby enabling a flexible function in the display device.

As an example, the conductive adhesive layer 130 may be an anisotropic conductive film (ACF), an anisotropic conductive paste, a solution containing conductive particles or the like. The conductive adhesive layer 130 allows an electrical interconnection in the Z direction through a thickness thereof, but it may be configured as a layer having electrical insulation in a horizontal X-Y direction. Accordingly, the conductive adhesive layer 130 may be referred to as a Z-axis conductive layer (hereinafter, referred to as a 'conductive adhesive layer').

The anisotropic conductive film is a film in which an anisotropic conductive medium is mixed with an insulating base member, and when heat and pressure are applied, only a specific portion becomes conductive by the anisotropic conductive medium. Hereinafter, the anisotropic conductive film is referred to as being subjected to heat and pressure, but other methods are also possible for the anisotropic conductive film to have partial conductivity. This method may be, for example, applying only one of the heat and pressure or UV curing.

In addition, the anisotropic conductive medium may be, for example, a conductive ball or conductive particles. According to the drawing, the anisotropic conductive film in this example is a film of the form in which the conductive ball is mixed in an insulating base member, when the heat and pressure are applied, only a specific part has conductivity by the conductive ball. The anisotropic conductive film may be a state in which the core of the conductive material contains a plurality of particles coated by an insulating film of a polymer material, and In this case, as the insulating film is destroyed in the part where heat and pressure are applied, the core becomes conductive. At this time, the shape of the core may be deformed to achieve a layer in contact with each other in the thickness direction of the film. As a more specific example, the heat and pressure are applied to the anisotropic conductive film as a whole, and the electrical connection in the Z-axis direction is partially formed by the difference in height between the counterparts bonded by the anisotropic conductive film.

As another example, the anisotropic conductive film may be a state containing a plurality of particles coated with a conductive material in the insulating core. In this case, the portion to which heat and pressure are applied is transformed (pressed) into a conductive material and becomes conductive in the thickness direction of the film. As another example, it is also possible that the conductive material has conductivity in the thickness direction of the film through an insulating base member in the Z-axis direction. In this case, the conductive material may have sharp ends.

According to the drawing, the anisotropic conductive film may be a fixed array ACF configured in a form in which the conductive ball are inserted into one surface of an insulating base member. More specifically, the insulating base member is formed of a material having adhesion, the conductive ball is disposed intensively on the bottom portion of the insulating base member, and when the heat and pressure are applied in the base member, it has conductive in a vertical direction as it is deformed with the conductive ball.

However, the present invention is not necessarily limited thereto, and the anisotropic conductive film has a form in which conductive balls are randomly mixed in an insulating base member, or a form in which the conductive ball are composed of a plurality of layers and is disposed on any one layer (double—ACF).

The anisotropic conduction paste is a combined form of paste and conductive ball, and it may be a paste mixed with a conductive ball in the base material of the insulation and adhesion. In addition, a solution containing conductive particles may be a solution in the form containing a conductive particle or nano particle.

Referring to the drawing again, the second electrode 140 is located in the insulating layer 160 spaced out from the auxiliary electrode 170. That is, the conductive adhesive layer 130 is disposed on the insulating layer 160 where the auxiliary electrode 170 and the second electrode 140 is located.

After forming a conductive adhesive layer 130 in the state where the auxiliary electrode 170 and the second electrode 140 are located in the insulating layer 160, when the semiconductor light emitting device 150 is connected in the form of a flip chip by applying heat and pressure, the semiconductor light emitting device 150 is electrically connected to the first electrode 120 and the second electrode 140.

Referring to FIG. 4, the semiconductor light emitting device may be a light emitting device of the flip chip type.

For example, the semiconductor light emitting device includes a p-type electrode 156, a p-type semiconductor layer 155 formed on the p-type electrode 156, an active layer 154 formed on the p-type semiconductor layer 155, an n-type semiconductor layer 153 formed on the active layer 154, and an n-type electrode 152 spaced apart from the p-type electrode 156 in a horizontal direction on the n-type semiconductor layer 153. In this case, the p-type electrode 156 may be electrically connected by the auxiliary electrode 170 and the conductive adhesive layer 130, and the n-type electrode 152 may be electrically connected to the second electrode 140.

Again, referring to FIG. 2, FIG. 3A and FIG. 3B, the auxiliary electrode 170 may be formed long in one direction, and one auxiliary electrode may be electrically connected to the plurality of semiconductor light emitting devices 150. For example, the p-type electrodes of the semiconductor light emitting elements of the left and right around the auxiliary electrode may be electrically connected to one auxiliary electrode.

More specifically, the semiconductor light emitting device 150 is pressed into the interior of the conductive adhesive layer 130 by heat and pressure. Through this, only the portion between the p-type electrode 156 and the auxiliary electrode 170 of the semiconductor light-emitting device 150 and the portion between the n-type electrode 152 and the second electrode 140 of the semiconductor light-emitting device 150 become conductive. The remaining portion has no conductivity because the semiconductor light emitting element is not pressed into. In this way, the conductive adhesive layer 130 is not only to inter-couple between the semiconductor light emitting device 150 and the auxiliary electrode 170 and between the semiconductor light emitting device 150 and the second electrode 140, as well as forming an electrical connection.

In addition, a plurality of semiconductor light emitting devices 150 comprises a light emitting device array, and a phosphor layer 180 is formed in each of the plurality of semiconductor light emitting devices of the light emitting device array.

The light emitting device array may include a plurality of semiconductor light emitting devices with different luminance values. Each semiconductor light emitting device 150 comprises a unit pixel, and is electrically connected to the first electrode 120. For example, the first electrode 120 may be in plural, semiconductor light emitting elements are arranged in a number of columns, for example, and the semiconductor light emitting elements of each column may be electrically connected to any of the plurality of first electrodes.

In addition, because the semiconductor light emitting devices are connected in the form of a flip chip, it is available to the semiconductor light emitting device grown on a transparent dielectric substrate. In addition, the semiconductor light emitting device may be, for example, a nitride semiconductor light emitting device. As the semiconductor light emitting device 150 has excellent luminance, it is capable of configuring individual unit pixel even with a small size.

According to the drawing, a wall 190 may be formed between the semiconductor light emitting devices 150. In this case, the wall 190 may serve to individually separate a unit pixel from each other, and may be integrally formed with the conductive adhesive layer 130. For example, the base member of the anisotropic conductive film may form the wall by inserting a semiconductor light emitting device 150 in an anisotropic conductive film.

In addition, if the base member of the anisotropic conductive film is black, the wall 190 may has a reflective property and increase contrast ratio even without a black insulator.

As another example, the reflective wall may be provided separately with the wall 190. In this case, the wall 190 may include a black or white insulator according to the purpose of the display device. When the wall of the white insulator is used, reflectivity may be increased, and when the wall of the black insulator is used, the contrast ratio may be increased while having a reflective characteristic.

The phosphor layer 180 may be located on the outer surface of the semiconductor light emitting device 150. For example, the semiconductor light emitting device 150 is a blue semiconductor light emitting device for emitting blue light B, and the phosphor layer 180 performs a function of converting the blue light B into the color of the unit pixel. The phosphor layer 180 may be a red phosphor 181 or a green phosphor 182 constituting an individual pixel.

That is, a red phosphor 181 capable of converting blue light B into red light R may be stacked on the blue semiconductor light emitting device in a position constituting a red unit pixel. A green phosphor 182 capable of converting blue light B into green light G may be stacked on the blue semiconductor light emitting device in a position constituting a green unit pixel. In addition, only the blue semiconductor light emitting device may be used alone in the portion forming a unit pixel of blue. In this case, the unit pixels of red R, green G, and blue B may achieve one pixel. More specifically, a phosphor of one color along each line of the first electrode 120 may be laminated. Thus, one line in the first electrode 120 may be an electrode to control one color. That is, along the second electrode 140, red R, green G and blue B may be arranged in turn, through which the unit pixel may be implemented.

However, the present invention is not necessarily limited thereto, and instead of a phosphor, the semiconductor light emitting device 150 and the quantum dot QD are combined to implement red R, green G, and blue B unit pixels.

In addition, a black matrix 191 may be disposed between each phosphor layer to improve the contrast ratio. That is, the black matrix 191 may improve contrast between light and dark.

However, the present invention is not necessarily limited thereto, and other structures for implementing blue, red, green may be applied.

Figure 5A:
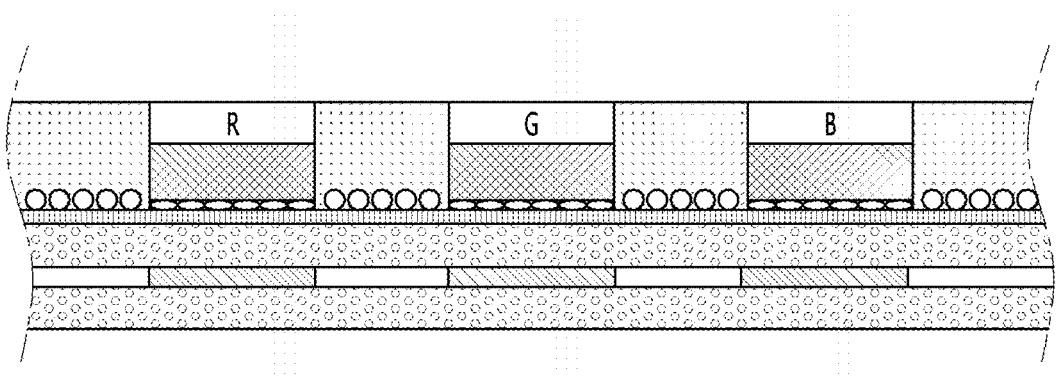
FIG. 5A to FIG. 5C are conceptual diagrams showing various forms of implementing a color in relation to a flip chip type semiconductor light emitting device.

Referring to FIG. 5A, each semiconductor light emitting device 150 is composed of gallium nitride (GaN) as the main material and add indium (In) and/or aluminum (Al) together to implement as a high-output light emitting device that emits various lights including blue.

In this case, the semiconductor light emitting device 150 may be red, green or blue semiconductor light emitting device to achieve a unit pixel respectively. For example, the red, green or blue semiconductor light emitting elements R, G and B are arranged alternately, and the unit pixels of red R, green G and blue B by the red, green and blue semiconductor light emitting elements form a single pixel, through which a full-color display may be implemented.

Figure 5B:
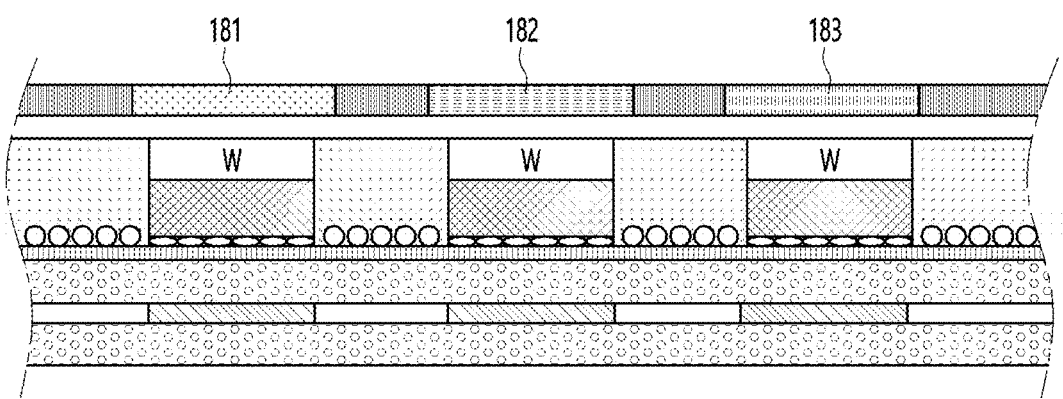

Referring to FIG. 5B, the semiconductor light emitting device may include a white (W) light emitting device including a yellow phosphor layer for each device. In this case, in order to achieve the unit pixel, a red phosphor layer 181, a green phosphor layer 182, and a blue phosphor layer 183 may be provided on the white (W) light emitting device. In addition, a unit pixel may be formed by using a color filter in which red, green, and blue colors are arranged on the white (W) light emitting element.

Figure 5C:
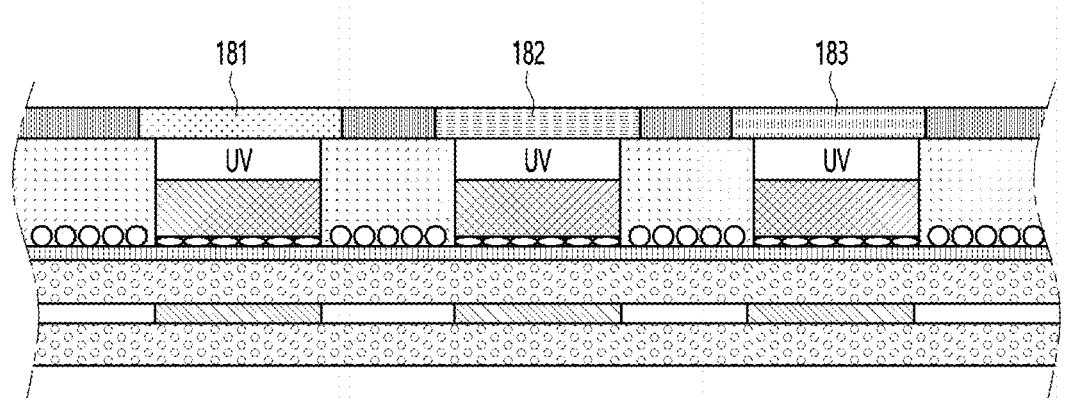

Referring to FIG. 5C, it also is possible that a structure in which a red phosphor layer 181, a green phosphor layer 182, and a blue phosphor layer 183 are provided on the ultraviolet (UV) light emitting device. In this way, the semiconductor light emitting device may be used in the whole area up to ultraviolet light UV as well as visible light, and ultraviolet light UV may be extended in the form of a semiconductor light emitting device that may be used as an excitation source of the phosphor.

Looking back at this example, the semiconductor light emitting device 150 is located on the conductive adhesive layer 130 to constituting a unit pixel in the display device. As the semiconductor light emitting device 150 has excellent luminance, it is capable of configuring individual unit pixel even with a small size. The size of the individual semiconductor light emitting device 150 may be less than 80 μm in length of a side, and may be a rectangular or square device. If it is a rectangle, it may be a size of less than 20 μm×80 μm.

In addition, even when a square semiconductor light emitting device 150 having a side length of 10 μm is used as a unit pixel, sufficient brightness is obtained to form a display device. In the case where the size of a unit pixel is a rectangular pixel having a side of 600 μm and the other side of 300 μm as an example, the distance between the semiconductor light emitting devices is relatively large. Thus, in this case, it is possible to implement a flexible display device having a high definition of a high-definition (HD) or higher.

A display device using the semiconductor light emitting device described above may be manufactured by a new type of manufacturing method. Hereinafter, the manufacturing method will be described with reference to FIG. 6.

Figure 6:
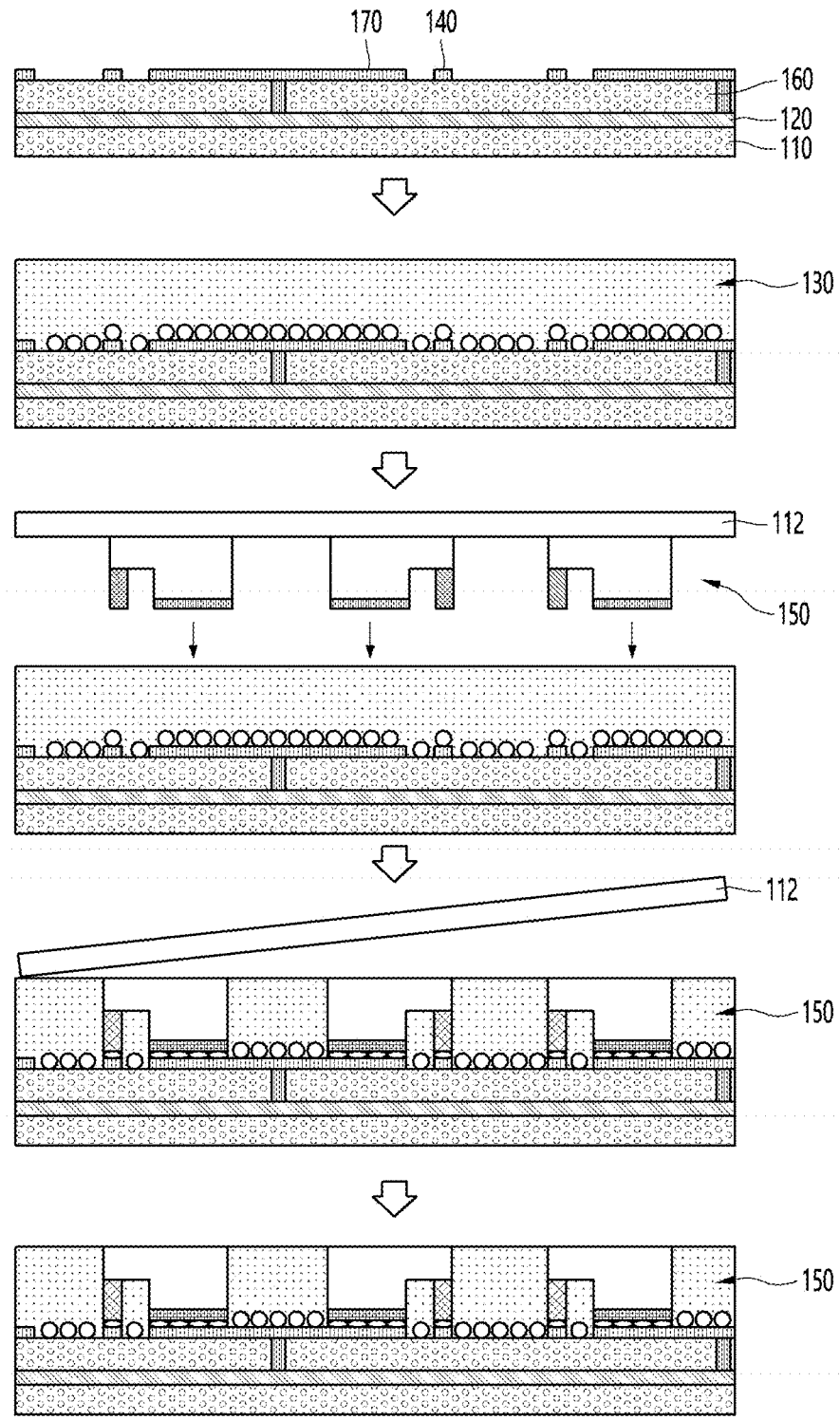
FIG. 6 is a section view showing a method for producing a display device using a semiconductor light emitting device of the present invention.

FIG. 6 is a section view showing a method for producing a display device using a semiconductor light emitting device of the present invention.

Referring to this drawing, a conductive adhesive layer 130 is formed on the insulating layer 160 where the auxiliary electrode 170 and the second electrode 140 are positioned. The insulating layer 160 is laminated to the first substrate 110 to form one substrate (or wiring substrate), a first electrode 120, an auxiliary electrode 170, and a second electrode 140 are disposed on the wiring substrate. In this case, the first electrode 120 and the second electrode 140 may be disposed in directions orthogonal to each other. In addition, in order to implement a flexible display device, each of the first substrate 110 and the insulating layer 160 may include glass or polyimide (PI).

The conductive adhesive layer 130 may be, for example, implemented by an anisotropic conductive film, and for this purpose anisotropic conductive film may be applied to the substrate where the insulating layer 160 is located.

Next, the second substrate 112 on which the plurality of semiconductor light emitting devices 150 corresponding to the positions of the auxiliary electrode 170 and the second electrode 140 and constituting individual pixels is located is disposed so that the semiconductor light emitting device 150 faces the auxiliary electrode 170 and the second electrode 140.

In this case, the second substrate 112 may be a growth substrate for growing the semiconductor light emitting device 150, and becomes a sapphire substrate or a silicon substrate.

When the semiconductor light emitting device is formed in a wafer unit, it may be effectively used in a display device by having a gap and a size that can achieve a display device.

Then, the wiring substrate and the second substrate 112 are thermally pressed. For example, the wiring substrate and the second substrate 112 may be thermally pressed by applying an ACF press head. The wiring substrate and the second substrate 112 by the thermal pressure may be bonded. Due to the characteristics of the anisotropic conductive film having conductivity by thermal compression, only the portion between the semiconductor light emitting element 150, the auxiliary electrode 170, and the second electrode 140 has conductivity. Through this, the electrodes and the semiconductor light emitting device 150 may be electrically connected. At this time, the semiconductor light emitting device 150 is inserted into the interior of the anisotropic conductive film, through which a wall may be formed between the semiconductor light emitting device 150.

Then, the second plate 112 is removed. For example, the second plate 112 may be removed using a laser lift-off (LLO) method or a chemical lift-off (CLO) method.

Finally, the second device 112 is removed to expose the semiconductor light emitting device 150 to the outside. If necessary, a transparent insulating layer (not shown) may be formed on the wiring substrate to which the semiconductor light emitting device 150 is coupled by coating silicon oxide (SiOx) or the like.

In addition, it may further comprise the step of forming a phosphor layer on one surface of the semiconductor light emitting device 150. For example, the semiconductor light emitting device 150 is a blue semiconductor light emitting device for emitting blue light B, a red phosphor or green phosphor for converting the blue light B into color of the unit pixel may form as a layer on one surface of the blue semiconductor light emitting device.

The method or structure of the display device using the semiconductor light emitting device described above may be modified in various forms. As an example, a vertical type semiconductor light emitting device may also be applied to the display device described above. Hereinafter, a vertical structure will be described with reference to FIGS. 5 and 6.

In addition, in the modified examples or embodiments described below, the same or similar reference numerals are given to the same or similar components as the previous example, and the description is replaced with the previous description.

Figure 7:
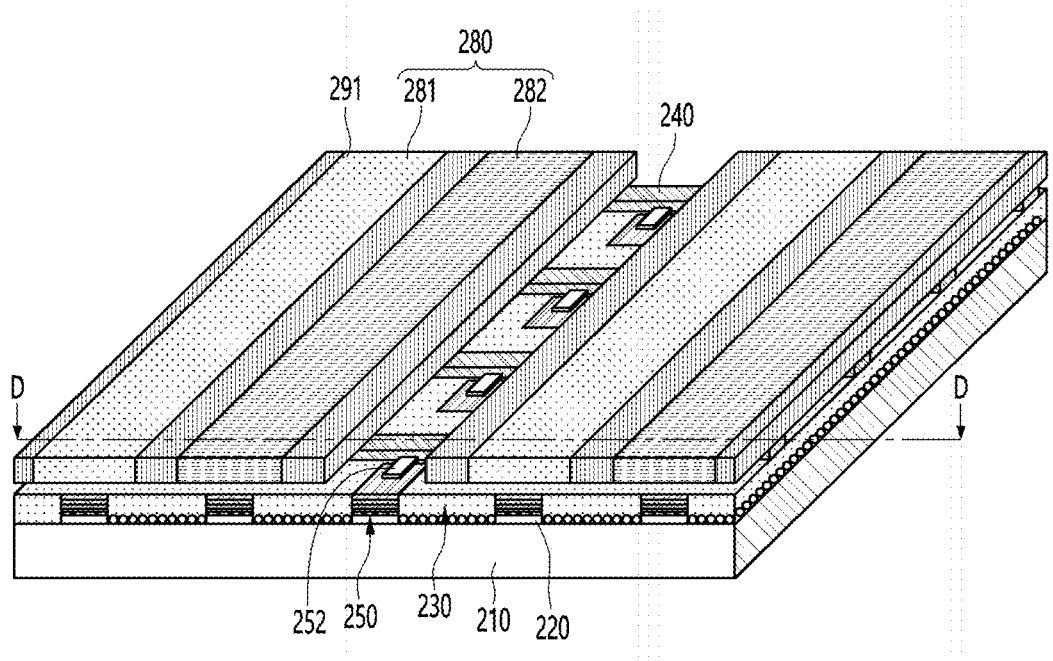
FIG. 7 is a perspective view showing another embodiment of a display device using a semiconductor light emitting device of the invention.
Figure 8:
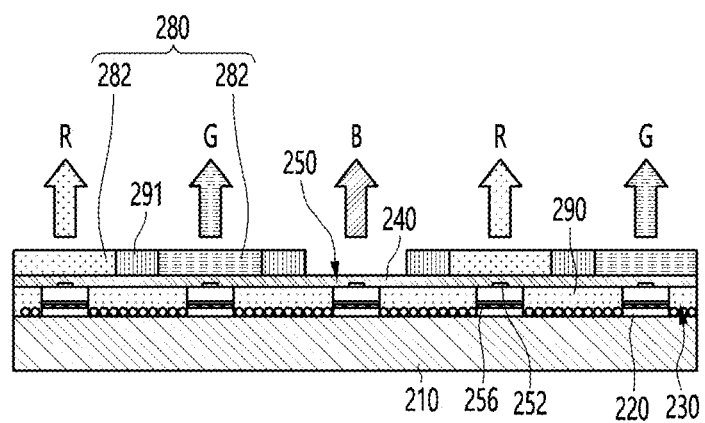
FIG. 8 is a cross-sectional view taken along line D-D of FIG. 7.
Figure 9:
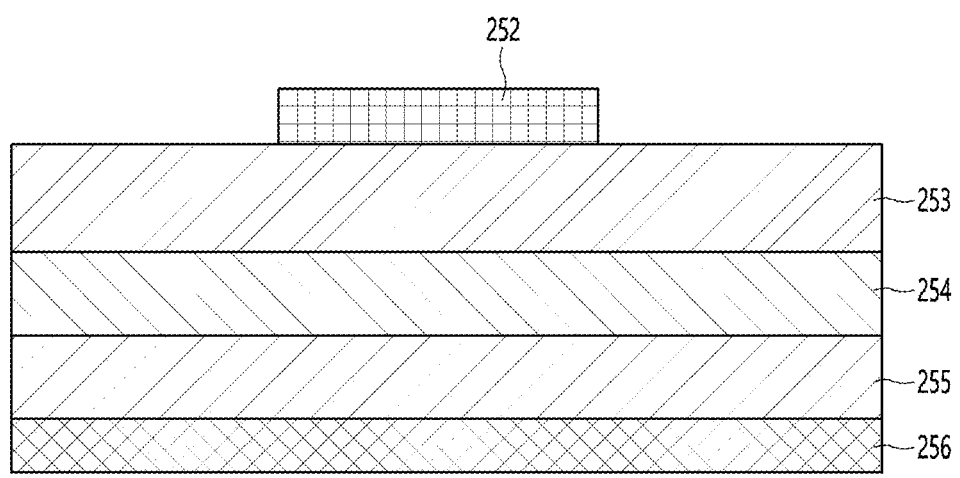
FIG. 9 is a conceptual diagram showing a vertical type semiconductor light emitting device of FIG. 8.

FIG. 7 is a view showing another embodiment of the display device using a semiconductor light emitting device of the invention, FIG. 8 is a cross-sectional view taken along line D-D of FIG. 7, FIG. 9 is a conceptual diagram showing a vertical type semiconductor light emitting device of FIG. 8.

Referring to these drawings, the display device may be a display device using a vertical type semiconductor light emitting device of the passive matrix (PM) method.

The display device comprises a substrate 210, a first electrode 220, a conductive adhesive layer 230, a second electrode 240 and a plurality of semiconductor light emitting devices 250.

The substrate 210 may include a polyimide (PI) to implement a flexible display device as a wiring substrate in which the first electrode 220 is disposed. In addition, any insulating and flexible material may be used.

The first electrode 220 is located on the substrate 210, may be formed of an electrode in the form of a long bar in one direction. The first electrode 220 may act as a data electrode.

The conductive adhesive layer 230 is formed on the substrate 210 where the first electrode 220 is located. Like a display device to which a flip chip type light emitting element is applied, the conductive adhesive layer 230 includes an anisotropic conductive film (ACF), an anisotropic conductive paste, and a solution containing conductive particles or the like. However, in the embodiment, it illustrates the case in which the conductive adhesive layer 230 is implemented by anisotropic conductive film.

After the anisotropic conductive film is placed on the substrate 210 in a state where the first electrode 220 is located, when the semiconductor light emitting device 250 is connected by applying heat and pressure, the semiconductor light emitting device 250 may be electrically connected to the first electrode 220. At this time, the semiconductor light emitting device 250 is preferably disposed to be located on the first electrode 220.

As described above, the electrical connection is generated because the anisotropic conductive film has partially conductivity in the thickness direction when heat and pressure are applied. Therefore, the anisotropic conductive film is divided into a conductive portion and a non-conductive portion in the thickness direction.

In addition, since the anisotropic conductive film contains an adhesive component, the conductive adhesive layer 230 implements mechanical coupling as well as electrical connection between the semiconductor light emitting device 250 and the first electrode 220.

In this way, the semiconductor light emitting device 250 is located on the conductive adhesive layer 230, thereby configuring the individual pixels in the display device. As the semiconductor light emitting device 250 has excellent luminance, it is capable of configuring individual unit pixel even with a small size. The size of such an individual semiconductor light emitting device 250 may be less than 80 μm in length of a side, it may be a rectangular or square device. In the case of a rectangle, it may be 20×80 μm or less in size.

The semiconductor light emitting device 250 may have a vertical structure.

The plurality of second electrodes 240 are disposed in a direction crossing the longitudinal direction of the first electrode 220 between the vertical semiconductor light emitting devices. The plurality of second electrodes 240 are electrically connected to the vertical semiconductor light emitting device 250.

Referring to FIG. 9, such a vertical semiconductor light emitting device includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. In this case, the p-type electrode 256 located at a lower portion may be electrically connected to the first electrode 220 and the conductive adhesive layer 230, and the n-type electrode 252 located at the top may be electrically connected to the second electrode 240, which will be described later. The vertical semiconductor light emitting device 250 has a great advantage in that the chip size can be reduced because the electrodes can be disposed vertically.

Again, referring to FIG. 8, a phosphor layer 280 may be formed on one surface of the semiconductor light emitting device 250. For example, the semiconductor light emitting device 250 is a blue semiconductor light emitting device 251 for emitting blue light B, and a phosphor layer 280 for converting the blue light B into color of the unit pixel may be provided. In this case, the phosphor layer 280 may be a red phosphor 281 and a green phosphor 282 constituting an individual unit pixel.

That is, a red phosphor 281 capable of converting blue light into red light R may be stacked on the blue semiconductor light emitting element at a position constituting a red unit pixel. A green phosphor 282 capable of converting blue light into green light G may be stacked on the blue semiconductor light emitting device at a location constituting a green unit pixel. In addition, only the blue semiconductor light emitting device may be used alone in the portion forming a unit pixel of blue. In this case, the unit pixel of red R, green G, and blue B may achieve one pixel.

However, the present invention is not necessarily limited thereto, and as described above in a display device to which a flip chip type light emitting element is applied, other structures for implementing blue, red, and green may be applied.

Looking back at the embodiment, the second electrode 240 is located between the semiconductor light emitting device 250, and is electrically connected to the semiconductor light emitting device 250. For example, the semiconductor light emitting device 250 is arranged in a plurality of columns, and the second electrode 240 may be located between the columns of the semiconductor light emitting device 250.

Because the distance between the semiconductor light emitting device 250 forming an individual pixel is sufficiently large, the second electrode 240 may be located between the semiconductor light emitting device 250.

The second electrode 240 may be formed as an electrode having a long bar shape in one direction, and may be disposed in a direction perpendicular to the first electrode.

In addition, the second electrode 240 and the semiconductor light emitting device 250 may be electrically connected by a connecting electrode protruding from the second electrode 240. More specifically, the connecting electrode may be an n-type electrode of the semiconductor light emitting device 250. For example, For example, the n-type electrode is formed as an ohmic electrode for ohmic contact, and the second electrode covers at least a portion of the ohmic electrode by printing or deposition. Through this, the second electrode 240 and the n-type electrode of the semiconductor light emitting device 250 may be electrically connected.

According to the drawing, the second electrode 240 may be located on the conductive adhesive layer 230. In some cases, a transparent insulating layer (not shown) including silicon oxide SiOx may be formed on the substrate 210 on which the semiconductor light emitting device 250 is formed. When the second electrode 240 is positioned after the transparent insulating layer is formed, the second electrode 240 is located on the transparent insulating layer. In addition, the second electrode 240 may be formed to be spaced apart from the conductive adhesive layer 230 or the transparent insulating layer.

If a transparent electrode such as ITO (Indium Tin Oxide) is used to position the second electrode 240 on the semiconductor light emitting device 250, the ITO material has a problem of poor adhesion to the n-type semiconductor layer. Thus, the present invention has the advantage of not having to use a transparent electrode such as ITO by positioning the second electrode 240 between the semiconductor light emitting devices 250. Accordingly, the light extraction efficiency can be improved by using a conductive material having excellent adhesion to the n-type semiconductor layer as a horizontal electrode without being restricted in selecting a transparent material.

According to the drawing, the wall 290 may be located between the semiconductor light emitting devices 250. That is, the wall 290 may be disposed between the vertical type semiconductor light emitting devices 250 to isolate the semiconductor light emitting devices 250 forming an individual pixel. In this case, the wall 290 may serve to separate the individual unit pixel from each other, and may integrally be formed with the conductive adhesive layer 230. For example, the base member of the anisotropic conductive film may form the wall by inserting a semiconductor light emitting device 250 into anisotropic conductive film.

In addition, if the base member of the anisotropic conductive film is black, the wall 190 may has a reflective property and increase contrast ratio even without a black insulator.

In addition, if the base member of the anisotropic conductive film is black, the wall 190 may has a reflective property and increase contrast ratio even without a black insulator.

If the second electrode 240 is located directly on the conductive adhesive layer 230 between the semiconductor light emitting devices 250, the wall 290 may be located between the vertical type semiconductor light emitting device 250 and the second electrode 240. Therefore, by using the semiconductor light emitting device 250, individual unit pixels can be formed even with a small size, the distance between the semiconductor light emitting devices 250 is relatively large so that the second electrode 240 can be positioned between the semiconductor light emitting devices 250 and a flexible display device having HD quality can be implemented.

In addition, according to the drawing, a black matrix 191 may be disposed between each phosphor layer to improve the contrast ratio. That is, the black matrix 191 may improve contrast between light and dark.

As described above, the semiconductor light emitting device 250 is located on the conductive adhesive layer 230, thereby constructing an individual pixel in the display device. As the semiconductor light emitting device 250 has excellent luminance, it is capable of configuring individual unit pixel even with a small size. Accordingly, a full color display in which red R, green G, and blue B unit pixels constitute one pixel can be implemented by the semiconductor light emitting device.

On the other hand, examples of the display device as described above may be a μLED display to which a micrometer-size LED is applied.

A manufacturing process of the μLED display may include a process of transferring a chip constituting a semiconductor light emitting device 150 or 250 to the substrate 110 or 210 using an interposer (not shown). The chips may include normal chips and defective chips. Hereinafter, among chips, normal chips are denoted by reference numeral 301, and defective chips are denoted by reference numeral 302.

A manufacturing process of a μLED display may include a repay process of removing defective chips 302 from among chips placed on an interposer. In addition, the manufacturing process of the μLED display may include a repay process of removing defective chips 302 from among the chips that have been placed on the substrates 110 or 210.

Hereinafter, the interposer and the substrates 110 and 210 are collectively referred to as a substrate, and reference numeral 300 is also denoted.

The repair process may be performed by a chip removing apparatus described later. Hereinafter, a chip removing apparatus for a repair process of a μLED display will be described.

Figure 10:
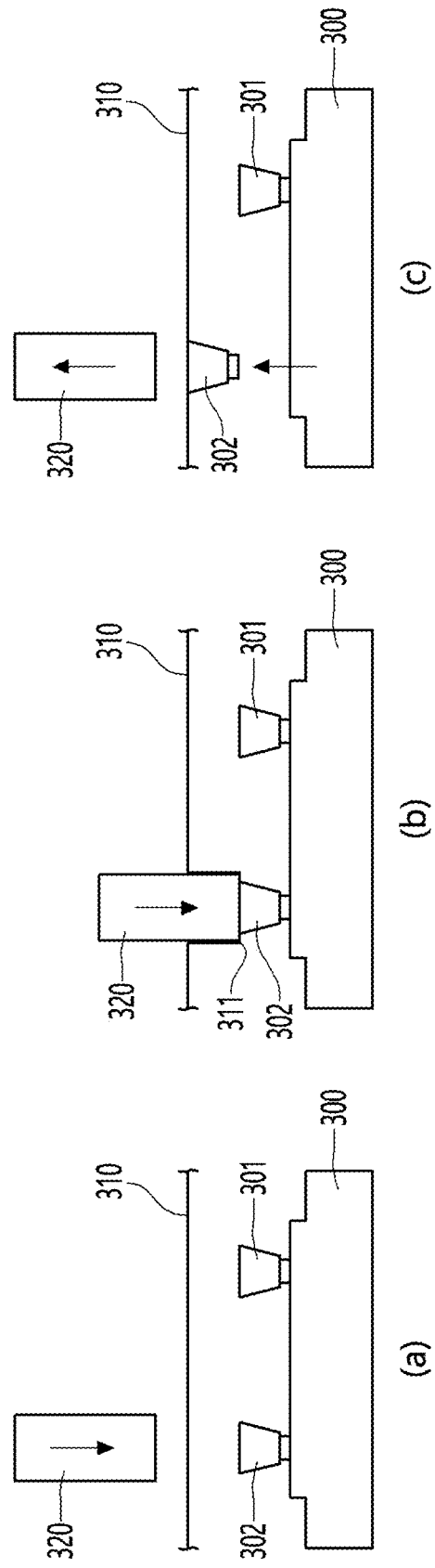
FIG. 10 is a diagram schematically showing a repair process of μLED display according to the embodiment.
Figure 11:
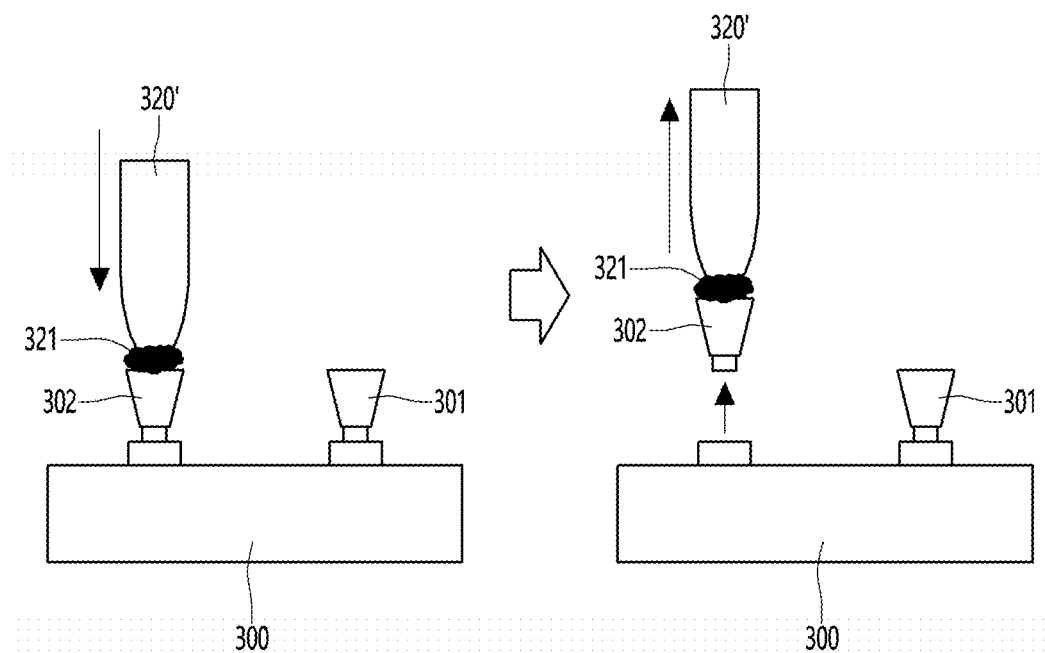
FIG. 11 is a diagram showing the other example of repairing a defective chip.
Figure 12:
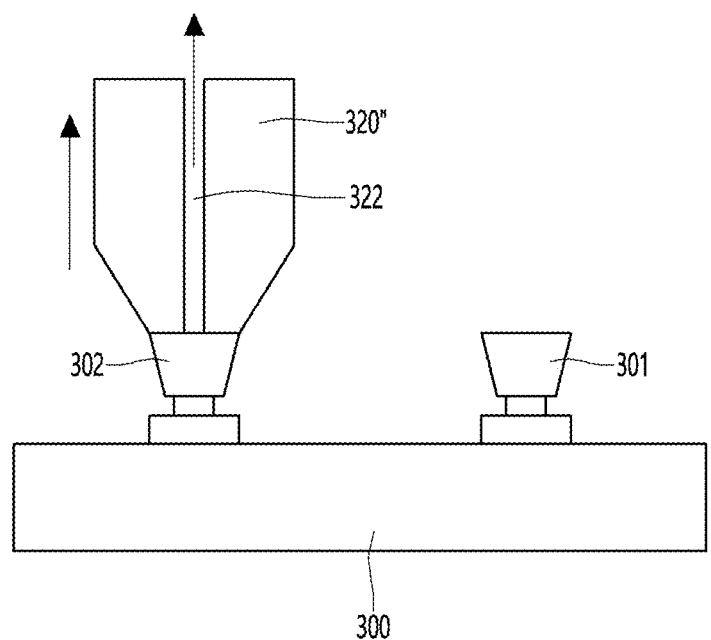
FIG. 12 is a diagram showing another example of repairing a defective chip.

FIG. 10 is a diagram schematically showing a repair process of μLED display according to the embodiment, FIG. 11 is a diagram showing the other example of repairing a defective chip, and FIG. 12 is a diagram showing another example of repairing a defective chip.

FIG. 10A is a diagram showing when the adhesive film 310 and the pin 320 are positioned on the substrate 300. The normal chip 301 and the defective chip (302; removal target chip) may be transferred together on the substrate 300, the adhesive film 310 may be positioned on the substrate 300 and spaced apart from the substrate 300, and the pin 320 may be positioned on the adhesive film 310. The pin 320 may be aligned to be positioned on the removal target chip 302 with the adhesive film 310 interposed therebetween.

FIG. 10B is a diagram showing which the pin 320 shown in FIG. 10A is lowered. The pin 320 may pressurize a portion 311 of the adhesive film 310, and the portion 311 pressurized by the pin 320 of the adhesive film 310 is deformed towards the removal target chip 302 may be in contact with the removal target chip 302.

FIG. 10C is a diagram showing which the pin 320 shown in FIG. 10B is raised. The portion 311 pressurized by the pin 320 during the rise of the pin 320 may be restored, and the removal target chip 302 may be lifted together with the adhesive film 310 in a state of being attached to the adhesive film 310 and separated from the substrate 300.

An adhesive force of the adhesive film 310 and the chip 302 may be greater than an adhesive force of the substrate 300 and the chip 302. The adhesive film 310 may be used a film with a large adhesive force.

The type of adhesive film 310 may be changed depending on an adhesive force of the chip 301 302 and the substrate 300.

After the defective chip 302 is transferred to the adhesive film 310, the pin 320 may be moved over another defective chip 302 transferred to the substrate 300. Operations shown in FIG. 10A, FIG. 10B and FIG. 10C may be repeated.

That is, the plurality of defective chips 302 transferred to the substrate 300 may be transferred onto the adhesive film 310.

On the other hand, in the example of the repair process shown in FIG. 11, the pin 320 ' directly separates the defective chip 302. In this case, an adhesive material 321 to which the defective chip 302 is attached may be provided at the lower end of the pin 320'.

The adhesive material 321 may be supplied to the lower end of the pin 320' before the pin 320' is lowered onto the defective chip 302.

The pin 320' after removing the defective chip 302 from the substrate 300, it is possible to transport the defective chip 302 to the defective chip collection box, the defective chip 302 may be separated from the pin 320'.

The example shown in FIG. 11 has no influence on the normal chips 301 around the defective chip 302. However, the process of supplying the adhesive material 321 to the pin 320' whenever one defective chip 302 is removed, the process of moving the pin 320' to the defective chip collection box from the pin 320' need to be performed.

When the plurality of defective chips 302 are removed, there is a disadvantage in that the overall process is increased and the working time is increased.

An example of the repair process shown in FIG. 12 is a suction pin in which the pin 320" directly separates the defective chip 302. In this case, a suction hole 322 (or vacuum hole) through which the defective chip 302 is suctioned may be formed in the pin 320".

After the pin 320" is lowered into the defective chip 302, the defective chip 302 may be suctioned through the suction hole 322. The pin 320" may remove the defective chip 302 from the substrate 300 and transport it to a defective chip collection box (not shown). The defective chip 302 may be separated from pin 320.

The example shown in FIG. 12 has no influence on the normal chips 301 around the defective chip 302. However, the size of the defective chip 302 that can be suctioned is limited according to the processing size of the suction hole 322. It is difficult to process a suction hole 322 of 20 μm or less in the pin 320", and the material of the pin 320" is also limited.

On the other hand, in the repair process shown in FIG. 10, the position of the pin 320 may be changed while the adhesive film 310 is placed on the substrate 300. In addition, a plurality of defective chips 302 may be attached to the adhesive film 310. As an example of the repair process shown in FIG. 10, the entire area of the adhesive film 310 coated with the adhesive material may be used without supplying and removing the adhesive material 321 shown in FIG. 11. In the example of the repair process shown in FIG. 10, processing of the pin 320 is easy compared to the suction pin 320" (see FIG. 12), and processing of a tip of 10 μm or less (i.e, the bottom of the pin 320) is possible such that it can be suitable for micro LED display.

Figure 13:
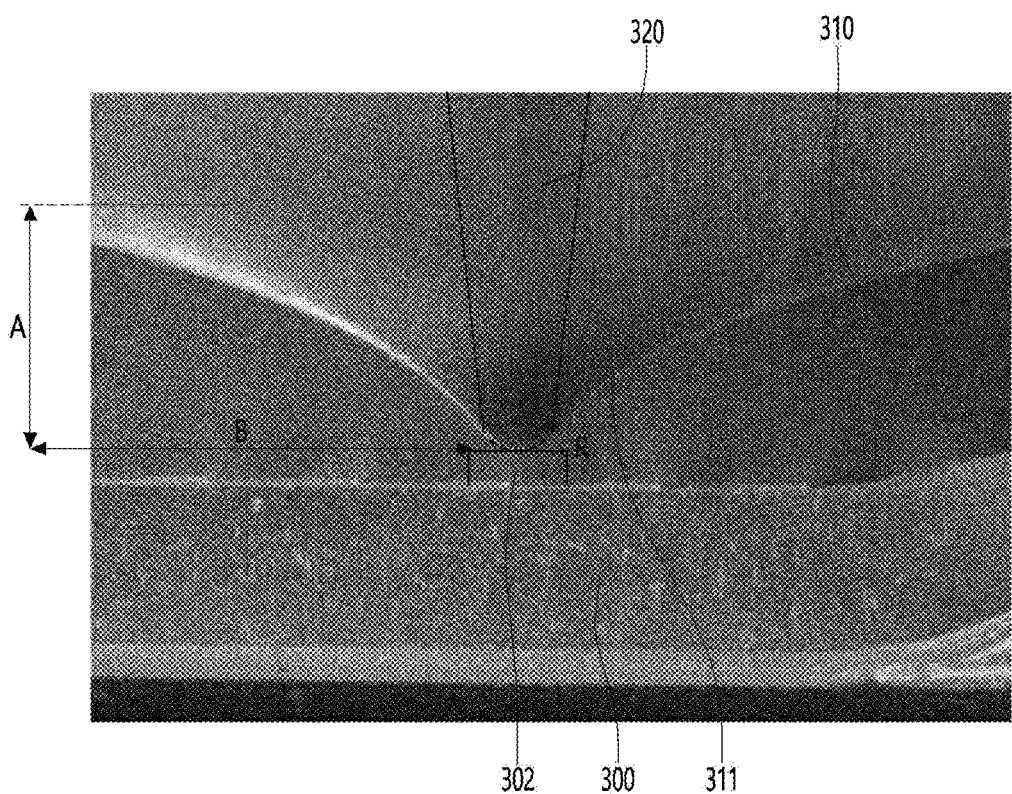
FIG. 13 is an enlarged view of the state of an adhesive film when the pin shown in FIG. 10 is lowered.

FIG. 13 is an enlarged view of the state of an adhesive film when the pin shown in FIG. 10 is lowered.

The position of the chip 301 or 302 transferred to the substrate 300 may be calculated by a inspection process (inspection data of the defective chip 302). When the position of the defective chip 302 to be removed and a center value of the pin 320 are aligned, unnecessary removal of the normal chip 301 can be prevented.

The size of the defective chip 302, the pitch of the chip 301 or 302, and the like may be factors that determine the type of adhesive film 310, the tension of the adhesive film 310, and the size of the pin 320.

According to the adhesive film 310 and the pin 320, the size and shape of a portion (311, hereinafter, referred to as a deformation portion) pressurized by the pin 320 of the adhesive film 310 may be different.

Depending on the adhesive film 310 and the pin 320, the deformable length A, the deformable radius B of the deformable portion 311, and the lower curvature R of the deformable portion 311 may be different.

The deformation length A, the deformation radius B, and the bottom curvature R are determined by the type of the adhesive film 310, the size of the pin 320 (in particular, the radius of the bottom tip of the pin 320), and the tension of the adhesive film 310. When these are adjusted, the adhesive film 310 can be prevented from contacting the normal chip 301 and only the defective chip 302 can be separated with high reliability.

Figure 14:
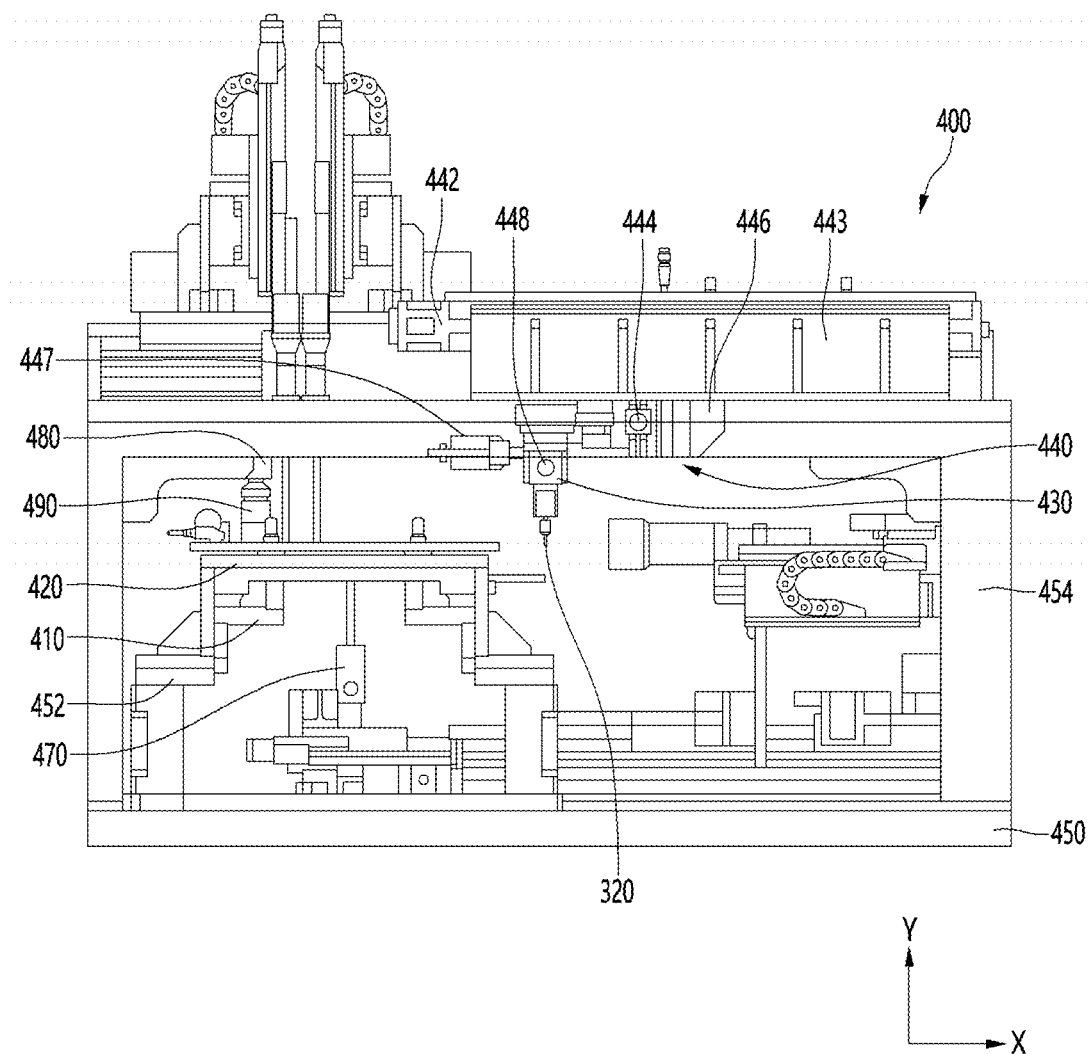
FIG. 14 is a diagram showing a chip removing apparatus for repair process of μLED display according to the embodiment.
Figure 15:
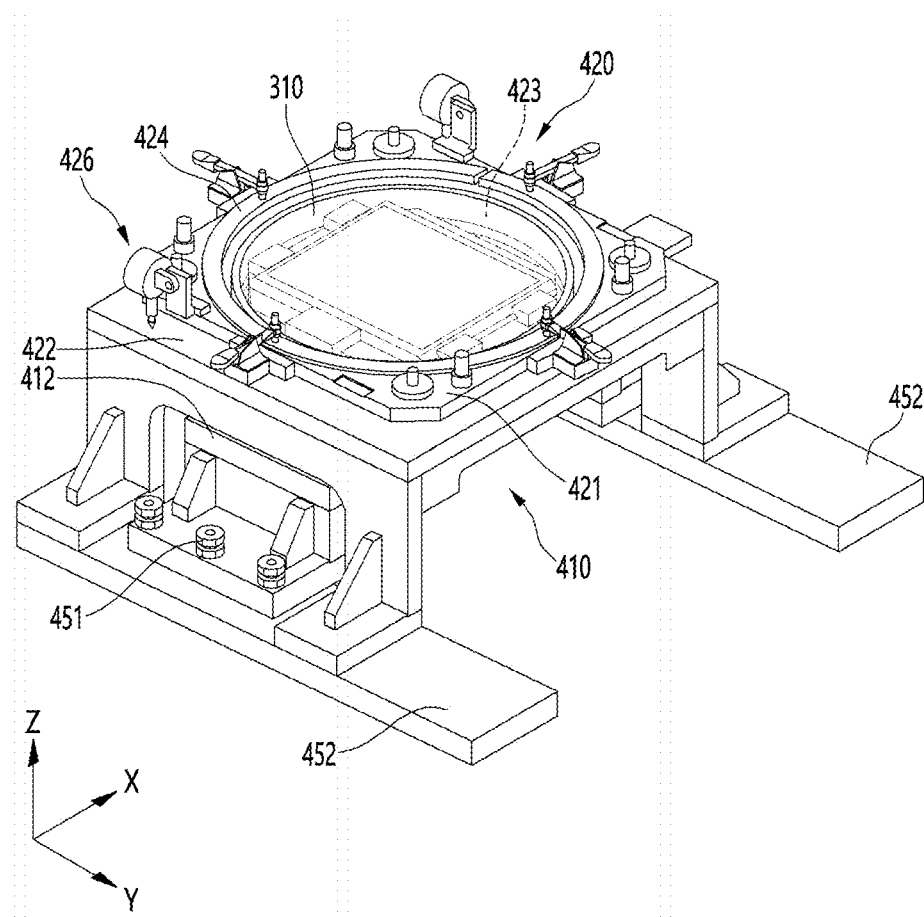
FIG. 15 is a perspective view shown in a stage and a film stage shown in FIG. 14.
Figure 16:
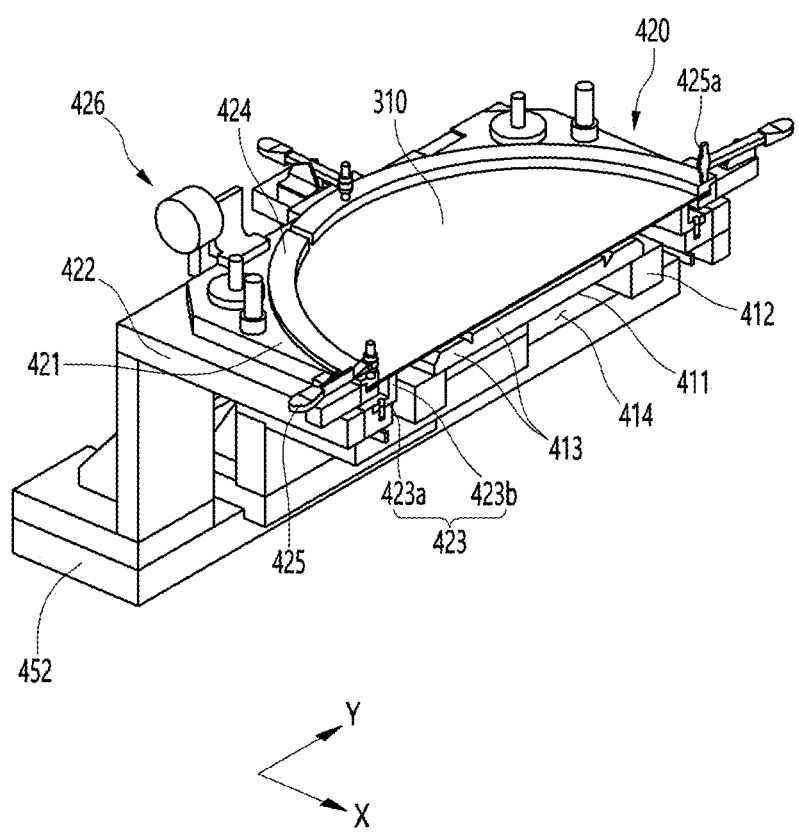
FIG. 16 is a partially cut perspective view of a chip removing apparatus shown in FIG. 14.

FIG. 14 is a diagram showing a chip removing apparatus for repair process of μLED display according to the embodiment, FIG. 15 is a perspective view shown in a stage and a film stage shown in FIG. 14, and FIG. 16 is a partially cut perspective view of a chip removing apparatus shown in FIG. 14.

The chip removing apparatus for repair process of μLED display (400) may include a stage unit 410, a film stage unit 420, a head 430 and a head driver 440.

The chip removing apparatus 400 may further comprise a base 450. The base 450 may support at least one of the stage unit 410 and the film stage unit 420.

The base 450 may constitute a lower surface of the chip removing apparatus 400.

The stage unit 410 may be disposed over the base 450.

A pedestal 452 may be disposed on the base 450. A lower portion of the stage unit 410 may be placed on the pedestal 452, and may be fastened to the pedestal 452 by a fastening member 451 such as a screw. A lower portion of the film stage unit 420 may be placed on the pedestal 452, and may be fastened with a fastening member such as a screw.

A base frame 454 may be disposed on the base 450. The base frame 454 may be built on the base 450. A head driver 440 may be mounted on the base frame 454.

The substrate 300 onto which at least one chip 301 or 302 (see FIG. 10) is transferred may be seated on the stage unit 410 by a transport mechanism (not shown) such as a robot.

The substrate 300 having a defective chip 302 may be seated on the stage unit 410. The stage unit 410 may hold the substrate 300 in an adsorption manner so that the defective chips 302 are not distorted during a repair process (i.e, a process of removing the defective chip).

Referring to FIG. 16, the stage unit 410 may include a substrate seating body 411 on which a substrate 300 is seated, and a stage frame 412 which supports the substrate seating body 411.

The substrate seating body 411 may be disposed on the stage frame 412. The substrate seating body 411 may be formed in a plate shape. The substrate seating body 411 may include a quartz material, and may be made transparent or translucent.

The stage unit 410 may include an adsorption line 413 which adsorbs the substrate 300. The adsorption line 413 may be provided on the stage unit 410 to attach the bottom of the substrate 300. The adsorption line 413 may be formed on the substrate seating body 411. At least one absorption hole (or vacuum hole) may be formed on the adsorption line 413. The absorption hole may face the substrate 300. The absorption hole may adsorb the substrate 300 seated on the substrate seating body 411.

The lower portion of the stage frame 412 may be placed on the pedestal 452, and may be fastened to the pedestal 452 with a fastening member 451 such as a screw.

An opening 414 may be formed on the stage frame 412. A lower vision 470 to be described later may sense the defective chip 302, the pin 320, and the head 430 through the opening 414.

The chip removing apparatus 400 may further comprise a substrate mover to move the substrate 300. The substrate mover may arrange the defective chip 302 coaxially with the head 430 through X-axis and Y-axis driving. A substrate mover may be disposed on the stage unit 410.

A plurality of chips 310 and 302 may be provided on the substrate 300. The substrate mover may move the defective chip 302 among the plurality chips 301 and 302 coaxially with the pin 320. The substrate mover is capable of moving the substrate 300 and moving the substrate seating body 411. The substrate mover may include an actuator such as a motor or cylinder operated to move the substrate 300.

The adhesive film 310 may be seated on the film stage 420. When the adhesive film 310 is seated on the film stage 420, it may be positioned on the substrate 300. A transport mechanism such as a robot may seat the adhesive film 310 on the film stage 420. Hereinafter, the film stage 420 will be described with reference to FIG. 17.

The head 430 includes a pin 320, and the pin 320 may pressurize a portion of the adhesive film 320 to attach the chip to a lower surface of the adhesive film 310.

The head driver 440 may move the head 430. The head driver 440 may move the head 430 in X, Y, and Z axes.

The chip removing apparatus 400 may further comprise a lower vision 470 (see FIG. 14) capable of monitoring the pin 320 through the stage unit 410.

When the head 430 is replaced, the lower vision 470 may perform concentricity sensing. When the substrate 300 is not mounted, the lower vision 470 may sense the head 430 through the stage unit 410 and the film stage unit 420.

After the chip removing apparatus 400 performs an operation to remove the chip 302, the lower vision 470 may sense whether the chip 302 is removed or not. That is, the removal of the defective chip 302 may be monitored.

The lower vision 470 may sense an alignment of the pin 320 and the substrate 300. When the pin 320 is moved to the alignment position by the head 430, the lower vision 470 may be sensing a position of the pin 320 or a position of the head 430. That is, the chip removing apparatus 400 may perform a pin alignment by the lower vision 470.

The chip removing apparatus may further comprise an upper vision 480 (see FIG. 14) which senses a position of the defective chip 302 among a plurality of chips.

The upper vision 480 may sense positional coordinate of the defective chip 302 transferred to the substrate 300. The upper vision 480 may be positioned above the adhesive film 310.

The chip removing apparatus 400 may adjust the position of the head 430 based on the position of the defective chip 302, and may align the head 430 or the pin 320 with the defective chip 302.

The chip removing apparatus 400 may include a sensor 490. An example of the sensor 490 (see FIG. 14) may be a displacement sensor. The sensor 490 may measure the distance between the lower end of the pin 320 and the adhesive film 310. Also, the sensor 490 may measure the distance between the lower end of the pin 320 and the substrate 300.

The sensor 490 may measure a gap between the stage unit 410 and the head driver 440 with the head driver 440 as a reference plane.

The chip removing apparatus 400 may be set a parallelism of the head driver 440 and the stage unit 410.

The sensor 490 may measure the exact distance between the pin 330 and the adhesive film 310. The chip removing apparatus 400 may calculate the reference surface from the distance measured by the sensor 490, and may then determine the travel distance of the pin 320 from the reference surface. The chip removing apparatus 400 may lower the pin 320 in the state in which the pin 320 is positioned on the reference surface.

Figure 17:
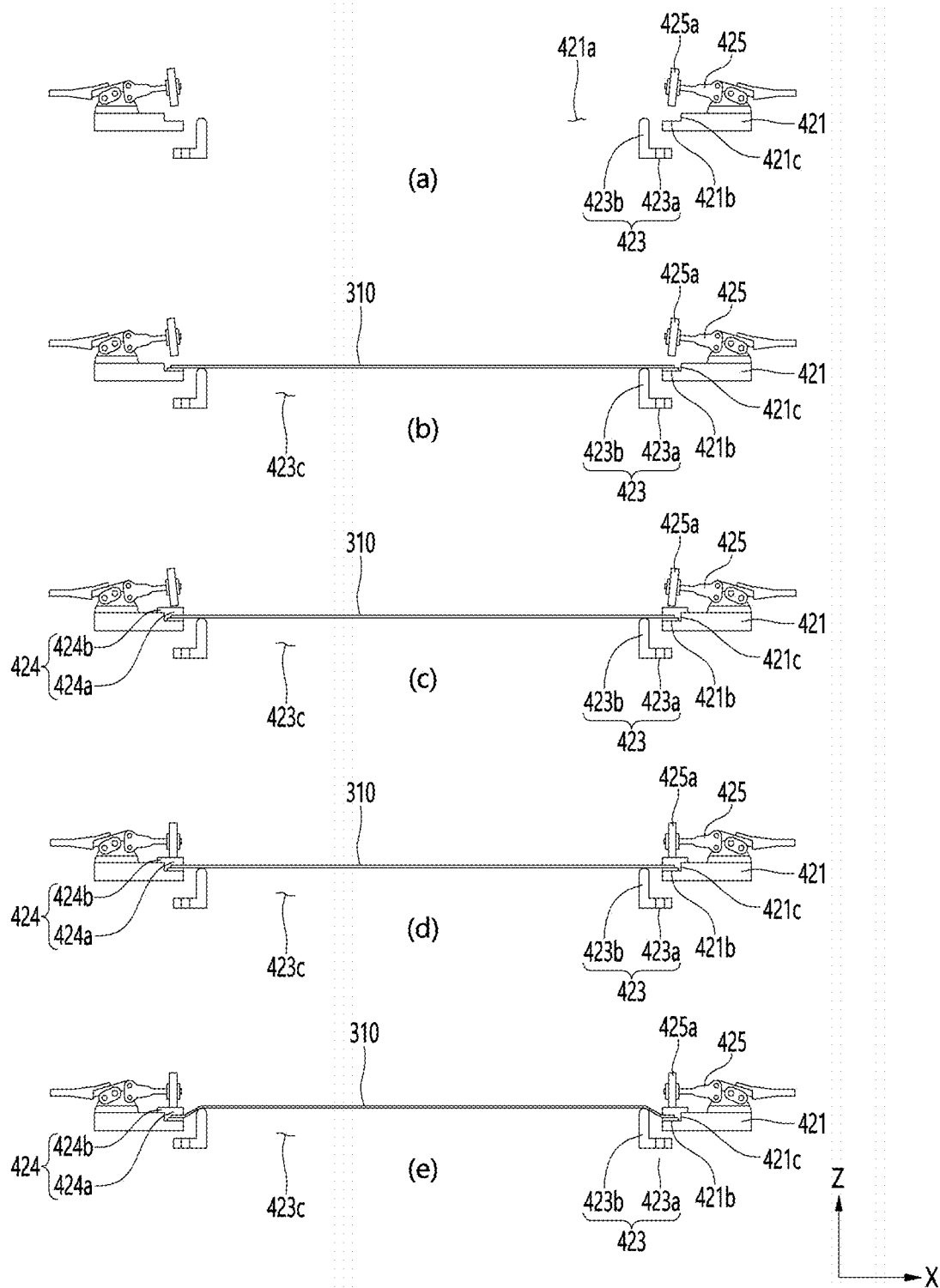
FIG. 17 is a diagram illustrating a process of fixing an adhesive film by a film stage shown in FIG. 14 and adjusting a tension of the adhesive film.

FIG. 17 is a diagram showing a process of fixing an adhesive film by a film stage shown in FIG. 14 and adjusting a tension of the adhesive film.

FIG. 17(a) is a diagram showing when the film stage 420 is in standby, FIG. 17(b) is a diagram showing when the adhesive film 310 is seated in the seating body 421, FIG. 17(c) is a diagram showing when the outer ring 424 is raised to the seating body 421, and FIG. 17(d) is a diagram showing when the outer ring holder 425 fixed the outer ring 424, FIG. 17(e) is a diagram showing when the seating body 421 is lowered with the adhesive film 310, the outer ring 424 and the outer ring holder 425.

The adhesive film 310 may be a sheet shape, and an adhesive material may be formed on a lower surface.

The film stage 420 may include a seating body 421 in which the adhesive film 310 is seated.

A hollow portion 421a in which the adhesive film 310 can be positioned may be formed on the seating body 421. The seating body 421 may include a seat portion 421b on which an edge of the adhesive film 310 is placed. An inner circumference 421c surrounding an outer circumference of the adhesive film 310 placed on the seat portion 421b may be formed on the seating body 421.

The hollow portion 421a may be formed in the inner circumference 421c. The seat portion 421b may be protruded from a lower portion of the inner circumference 421c.

The adhesive film 310 may be seated on the seat portion 421b and protected by the inner circumference 421c. The inner circumference 421c may limit the movement of the adhesive film 310.

The seating body 421 may be disposed to be fixed to a frame 22 or may be disposed on the frame 422 so as to be able to move up and down.

The film stage 420 may include a frame 422. As shown in FIG. 15 and FIG. 16, a lower portion of the frame 422 may be placed on the pedestal 452, and may be fastened to the pedestal 452 with a fastening member such as a screw.

The film stage 420 may include an inner ring 423 and an outer ring 424.

The adhesive film 310 may be placed on the inner ring 423. The size of the inner ring 423 may be smaller than that of the adhesive film 310. The adhesive film 310 may be seated on an upper portion of the inner ring 423.

The inner ring 423 may be disposed to be fixed to the frame 422 or may be disposed on the frame 422 so as to be able to move up and down. When the inner ring 423 is fixed to the frame 422, the inner ring 423 may include a fastening portion 423a fastened to the frame 422 with a fastening member such as a screw.

The inner ring 423 may include a seating portion 423b on which the adhesive film 310 is seated. The seating portion 423b may extend upward from the fastening portion 423a, and the adhesive film 310 may be seated on an upper end of the seating portion 423b.

An opening 423a may be formed on the inner ring 423. The lower vision 470 may sense the pin 320 and the head 430 through the opening 423c. The opening 423c may be formed on the seating portion 423b.

The outer ring 424 may hold the adhesive film 310 together with the inner ring 423. The outer ring 424 may include a fixing portion 424a that is inserted into the inner circumference 421c of the seating body 421 and fixes the adhesive film 310 seated on the seat portion 421b. The outer ring 424 may further include a seating portion 424b that extends outward from the fixing portion 424a and is seated around the inner circumference 421c.

The film stage 420 may further include an outer ring holder 425 disposed on the seating body 421 to press the outer ring 424 downward. Referring to FIG. 17, the outer ring holder 425 may be rotatably connected to the seating body 421. The outer ring holder 425 may include a pressure pin 425a in contact with an upper surface of the outer ring 424.

The film stage 420 may further include a lifting mechanism 426 (see FIG. 15 and FIG. 16) for moving up and down at least one of the inner ring 423 and the outer ring 424.

The lifting mechanism 426 may move up and down the outer ring 424 by moving up and down the seating body 412. The lifting mechanism 426 may be disposed on the frame 422 to move up and down the seating body 421. The lifting mechanism 424 may include a driving source such as a motor and a power transfer member such as a gear or belt that transfers a driving force of the driving source between the driving source and the seating body 421.

As shown in FIG. 17(d), in a state where the adhesive film 310 is seated on the seating body 421 and the outer ring 424 presses the adhesive film 310, the lifting mechanism 424 may lower the seating body 421.

As shown in E of FIG. 17(e), in the adhesive film 310, a portion of located between the seating body 421 and the outer ring 424 and a portion placed on top of the inner ring 423 may be bent, respectively, and tension of the adhesive film 310 may be adjusted.

After the adhesive film 310 is placed on the seating body 421, the film stage 420 configured as described above may perform precise film tension correction for processing. In addition, when replacing the adhesive film 310, the same tension should be maintained.

When the tension of the adhesive film 310 is out of the appropriate range, the adhesive film 310 may be damaged, and the defective chip 302 may not be removed.

The tension of the adhesive film 310 should be maintained within the appropriate range.

Figure 18:
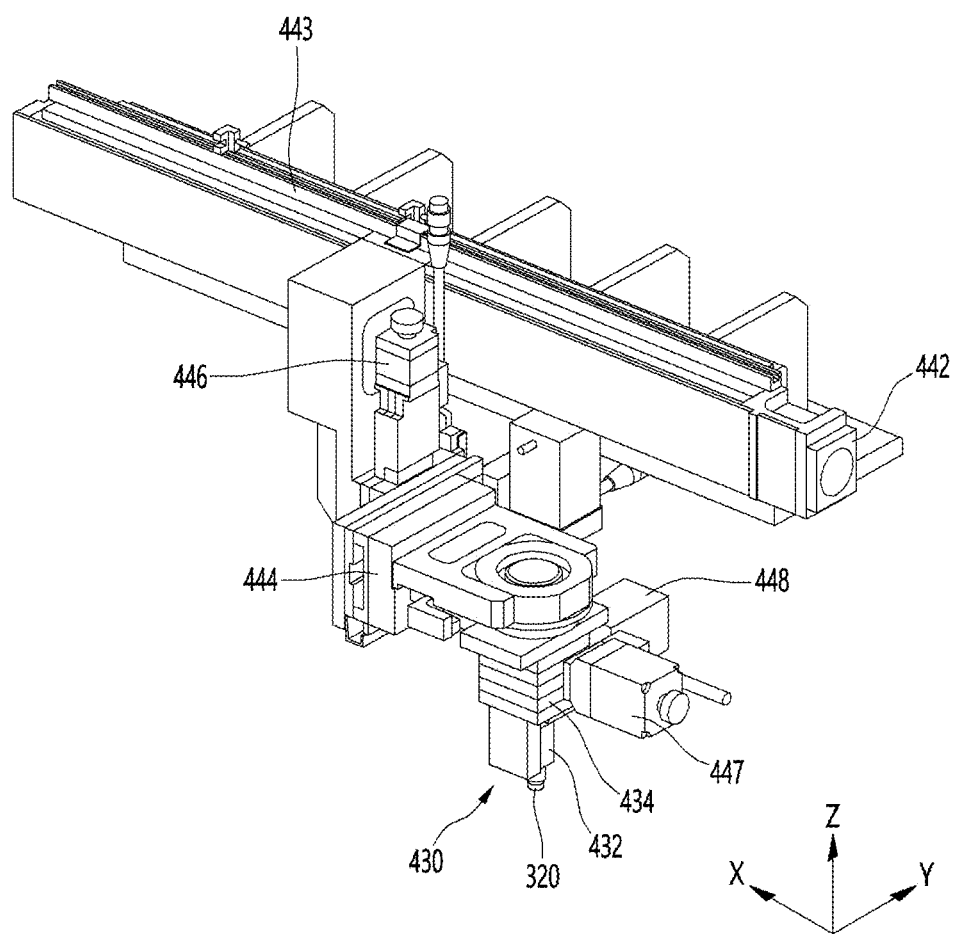
FIG. 18 is a perspective view showing a head and a head driver according to the embodiment.

FIG. 18 is a perspective view showing a head and a head driver according to the embodiment.

The head 430 may include a pin 320 and a voice coil motor (VCM) 432.

The pin 320 may be molded to a micrometer size and may be formed of a material that does not damage the adhesive film 310. The pin 320 may be disposed on a lower portion of the VCM 432 and may be moved up and down according to the operation of the VCM 432.

The VCM 432 may be an actuator that linearly moves the pin 320. The head 430 may include a head body 434 to which the VCM 432 is mounted.

The VCM 432 uses the Lorentz force generated by the induced magnetic force of the coil in the magnetic field of the permanent magnet, and may precisely linearly move the pin 320 over a relatively short distance.

The VCM 432 may control the lifting speed of the pin 320 and the moving amount (moving distance) of the pin 320.

When the adhesive film 310 contacts the defective chip 302, the pin 320 may be damaged by the adhesive film 310. When the pin 320 is operated by the VCM 432, damage to the pin 320 can be minimized by precise control of the VCM 432.

The head 430 may be connected to the head driver 440 and move in three dimensions. The head driver 440 may be connected to the head body 434.

The head driver 440 may include a 3-axis moving mechanism. The head driver 440 may include an X-axis actuator 442, a Y-axis actuator 444, and a Z-axis actuator 446. The head driver 440 may move the head 430 in the X-axis, Y-axis, and Z-axis.

The X-axis actuator 442, the Y-axis actuator 444, and the Z-axis actuator 446 may each include a driving source such as a motor, and a power transmission member such as a motor and a power transfer member such as a gear or belt that transfers a driving force of the driving source.

The X-axis actuator 442, the Y-axis actuator 444, and the Z-axis actuator 446 may each move the head 430 to a position of an upper side of the defective chip 302.

As an example of a three-axis movement mechanism, the X-axis actuator 442 mounted on the guide 443 may move the Z-axis actuator 446 in the X-axis, and the Z-axis actuator 446 may move the Y-axis actuator 444 up and down in the Z-axis, and the Y-axis actuator 444 may move the head 430 in the X-axis.

The guide 443 may be mounted on the base frame 450 (see FIG. 14) and supported by the base frame 450.

The head driver 440 may include a tilting mechanism 432 and 434 for tilting the pin 320.

The tilting mechanism 432 and 434 may include an X-axis tilter 447 (Tx) and a Y-axis tilter 448 (Ty).

The X-axis tilter 447 (Tx) and Y-axis tilter 448 (Ty) may be connected to the head body 434. The X-axis tilter 447 (Tx) may tilt the head 430 around the X-axis, and the Y-axis tilter 448 (Ty) may tilt the head 430 around the Y-axis.

Hereinafter, the operation of the chip removal device 400 of the embodiment will be described.

In the substrate 300 on which the chips 301 and 302 are disposed, positional coordinate of the defective chips 302 may be collected by transfer/characteristic inspection. The substrate 300 on which the defective chip 302 are disposed may be loaded into the stage unit 410.

After the substrate 300 on which the defective chip 302 is disposed is loaded into the stage unit 410, the adhesive film 310 may be loaded onto the film stage unit 420.

The adhesive film 310 loaded on the film stage unit 420 may have an adhesive force greater than the adhesive force between the chip and the substrate 300. Types of the adhesive film 310 may be different depending on the adhesive force between the chip and the substrate 300.

After the adhesive film 310 is loaded onto the film stage unit 420, the upper vision 480 may detect the position of the defective chip 302.

Thereafter, the head driver 440 may position the head 430 on the defective pin 302, and when the head 430 is positioned on the defective pin 302, the head 430 may lower the pin 302.

A part of the adhesive film 310 positioned on an upper side of the defective chip 302 may be locally lowered by the pin 320 and may come into contact with the defective chip 302.

The head driver 440 may move the head 430 up, and the defective chip 302 attached to the substrate 300 may be separated from the substrate 300 while being adhered to the lower surface of the adhesive film 310.

The above description is merely an example of the technical idea of the present invention, and various modifications and variations can be made to those skilled in the art without departing from the essential characteristics of the present invention.

Therefore, the embodiments disclosed in the present invention are not intended to limit the technical idea of the present invention, but to explain, and the scope of the technical idea of the present invention is not limited by these embodiments.

The protection scope of the present invention should be construed according to the claims below, and all technical ideas within the equivalent range should be construed as being included in the scope of the present invention.

What is claimed is:

1. A chip removing apparatus for repair process of a micro-LED display, comprising:
   a stage unit on which a substrate on which at least one chip is disposed is seated;
   a film stage on which an adhesive film is seated to position the adhesive film on the substrate;
   a head having a pin for pressing the adhesive film to attach the chip to a lower surface of the adhesive film; and
   a head driver configured to move the head,
   wherein the film stage includes:
   a seating body on which the adhesive film is placed;
   an outer ring holder disposed on the seating body configured to secure the adhesive film between an outer ring and the seating body; and
   an inner ring configured to provide tension to the adhesive film.

2. The chip removing apparatus of claim 1, further comprising:
   a base configured to support the stage unit and the film stage.

3. The chip removing apparatus of claim 1, wherein the stage unit includes a substrate seating body on which the substrate is seated, and
   wherein the substrate seating body is transparent or translucent.

4. The chip removing apparatus of claim 1, wherein the stage unit includes an adsorption line for adsorbing the substrate.

5. The chip removing apparatus of claim 1, wherein the film stage further includes:
   a lifting mechanism configured to move up and down at least one of the inner ring or the seating body.

6. The chip removing apparatus of claim 1, wherein the head driver moves the head in X, Y, and Z axes.

7. The chip removing apparatus of claim 1, wherein the head driver includes a tilting mechanism for tilting the pin.

8. The chip removing apparatus of claim 1, further comprising:
   a sensor configured to measure a distance between a lower end of the pin and the adhesive film or a distance between the lower end of the pin and the substrate.

9. The chip removing apparatus of claim 1, wherein the chip is one of a plurality of chips on the substrate,
   further comprising:
   an upper vision configured to sense a position of a defective chip among the plurality of chips.

10. The chip removing apparatus of claim 1, further comprising:
    a lower vision configured to monitor the pin through the stage unit.

11. The chip removing apparatus of claim 1, wherein the outer ring holder is rotatably connected to the seating body.

* * * * *